United States Patent
Van Eijk et al.

(10) Patent No.: US 7,375,479 B2
(45) Date of Patent: May 20, 2008

(54) APPARATUS FOR PROCESSING AN OBJECT WITH HIGH POSITION ACCURANCY

(75) Inventors: Jan Van Eijk, Eindhoven (NL); Arjan Franklin Bakker, Eindhoven (NL); Dennis Erwin Bos, Eindhoven (NL); Johan Cornelis Compter, Eindhoven (NL); Angelo Cesar Peter De Klerk, Eindhoven (NL); Franciscus Martinus Roes, Eindhoven (NL); Hubert Gerard Jean Joseph Amaury Vroomen, Eindhoven (NL); Thomas Petrus Hendricus Warmerdam, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 520 days.

(21) Appl. No.: 10/539,371

(22) PCT Filed: Dec. 15, 2003

(86) PCT No.: PCT/IB03/05935

§ 371 (c)(1), (2), (4) Date: Jun. 15, 2005

(87) PCT Pub. No.: WO2004/055607

PCT Pub. Date: Jul. 1, 2004

(65) Prior Publication Data

US 2007/0069666 A1 Mar. 29, 2007

(30) Foreign Application Priority Data

Dec. 16, 2002 (EP) .................................. 02080317

(51) Int. Cl.
*H02K 41/00* (2006.01)
*H02P 1/00* (2006.01)
*H02P 3/00* (2006.01)
*H02P 5/00* (2006.01)
*H02P 7/00* (2006.01)

(52) U.S. Cl. ...................................................... 318/135

(58) Field of Classification Search .................... None
See application file for complete search history.

(56) References Cited

U.S. PATENT DOCUMENTS

| 5,387,851 A | 2/1995 | Nuscheler et al. |
| 5,814,774 A | 9/1998 | Remmers et al. |
| 2003/0007140 A1 | 1/2003 | Korenaga |

FOREIGN PATENT DOCUMENTS

| EP | 0342639 A2 | 11/1998 |
| JP | 04094104 A | 3/1992 |

*Primary Examiner*—Lincoln Donovan
*Assistant Examiner*—Erick Glass (57) ABSTRACT

A apparatus processes an object (19), such as a semiconductor wafer at accurately controlled positions. The object (19) is supported by a working platform (12) that is moveable along a path. A suspension actuator part (14) attached to the working platform (12), contains a soft magnetic core (24) with poles facing the surface of a soft magnetic element (34) on the support structure along the path and a winding (20) for application of a current to generate a magnetic field that runs through the core (24) v the poles and returns via the soft magnetic element (34). A sensor (17) senses a measured position of the suspension actuator part (14) relative to the position reference element (16). A control circuit comprises an outer control circuit (40) and an inner control circuit (42). The outer control circuit (40) receives a sensing result and determines force set point information to regulate the measured position of the actuator part (14) to a required value. The inner control circuit (42) receives the force set point information and controls the current to realize a force between the actuator part (14) and the support structure (10) according to the force set point information.

21 Claims, 6 Drawing Sheets

APPARATUS FOR PROCESSING AN OBJECT WITH HIGH POSITION ACCURANCY

The invention relates to precision equipment that uses a charged particle beam to process an object on an accurately positioned table that performs scanning or stepped movements. The invention also relates to accurate positioning equipment for lithographic equipment for example. Furthermore the invention relates to equipment with magnetic reluctance actuators.

U.S. patent application No. 2003/0007140 (Korenaga) describes a waferstage movement apparatus. During processing of semi-conductor wafers it is necessary to perform very accurate positioning of a table with a wafer on it, in combination with stepped or scanning movements of the table. The position of the table has to be independent of environmental vibrations. This requires special equipment for movement and suspension of the table. For this purpose linear motors have conventionally been used, which operate according to the Lorentz principle. That is, such motors contain a winding that is moveably suspended in a magnetic field and an electric current source for generating forces by the application of current through the windings. A series of permanent magnets generates the magnetic field in the space through which the windings move. Similar techniques may be used to realize a magnetic bearing (maglev) according to the Lorentz principle. One advantage of using movement control based on the Lorentz principle is that the generated forces are hardly affected by vibration of the support structure.

One of the problems with movement or magnetic bearing based on the Lorentz principle is that it involves considerable power dissipation. The resulting heating causes various problems such as additional vibrations, directly or indirectly due to the need for cooling or deformation caused by thermal effects. Korenaga describes a solution for reducing energy consumption. Korenaga uses long stroke linear motors that move a short stroke fine positioning stage. The windings of the linear motors are wound around an iron core, which reduces the power consumption required for generating movement, but suffers from the fact that the core tends to clog to the magnets of the motor, which has the result that vibrations from the magnets are transmitted to the table and makes it difficult to realize accurate position control.

Nevertheless, Korenaga realizes accurate positioning by adding the fine positioning stage, which has small actuators that also use the Lorentz principle, but do not contain an iron core in the windings. The linear motors are used only to realize movements when the short stroke actuators threaten to go out of range. The core free windings used according to the Lorentz principle transmit little or no vibrations, because they generate a force that is hardly dependent on the relative position of the windings and the magnets that generated the magnetic field.

In addition, Korenaga uses an electromagnetic coupling between the small stroke actuators and the final table. The electromagnetic coupling is realized with a central magnetizable cylinder and a number of E-shaped magnetic cores, with legs that face the cylinder and windings around the legs to generate magnetic fields. The electromagnetic coupling is used to compensate for the effect of acceleration of the linear motors on the table. Positioning is left to the fine positioning stage, so that the clogging effect of the magnetic cores plays no role.

The use of the Lorentz principle in such a movement system has various disadvantages. As already noted by Korenaga, there is a problem with heat generation if windings are used without core. This problem is reduced to a certain extent by using such windings only for fine movement.

Moreover, in imaging equipment that uses a beam of charged particles (for example E-beam writers), which is directed at the table carried by the motor or bearings, there is the additional problem that the magnetic fields of the actuators perturbs the beam. Often this forces placement of the motors and/or magnetic bearings at a large distance from the beam, with a mechanical transmission coupled between the table and the motors or bearings. Such a long distance transmission makes position control awkward. This problem too can be reduced by using a magnetizable core in the windings, to the extent that this core localizes the magnetic fields, but the clogging problem signalled by Korenaga makes this problematic.

Among others, it is an object of the invention to provide for an apparatus with accurate positioning equipment that is compatible with beams of charged particles and/or generates little heat.

Among others, it is an object of the invention to provide for such an apparatus, wherein magnetic material is used in both stators and translators wherein transmission of vibrations is reduced.

An apparatus according to one aspect of the invention is set forth in claim 1. According to this aspect a reluctance actuator is used for suspending an object table that is moved along a processing path during precision processing of an object. The reluctance actuator comprises a passive soft magnetic counter surface that extends in parallel with the processing path on a support structure for the table. Attached to the table, the reluctance actuator contains an active part that contains a soft magnetic core with poles facing the counter surface. The position of the active part perpendicular to the surface is regulated by generating magnetic forces by current through a winding around the core.

The current through the winding is controlled in a nested control circuit. In an outer control circuit information about the position of the active part relative to a reference that is mechanically isolated from the counter surface is measured and used to compute force set point information indicative of a force that has to be exerted by the reluctance actuator. The force set point information may represent a number proportional to the force or to the square root of the force for example.

In an internal control circuit the force set point information is used to control the current through the winding. The inner loop has a much faster response characteristic than the outer loop, whose response speed is limited by mechanical factors. As a result, clogging is prevented and vibrations or induced deformations of the counter surface do not affect positioning, which makes it possible to use a reluctance actuator for precision processing.

By hindsight, it may be noted that U.S. Pat. No. 5,814,774 discloses an elevator wherein a reluctance actuator with a controlled force is applied to provide a smooth ride and that U.S. Pat. No. 5,387,851 discloses an engine for a submarine, wherein a reluctance actuator with a controlled force is used to prevent engine vibrations from being transmitted to the base of the engine. Obviously, these publications are not in the art of processing equipment with accurately positioned object tables.

Preferably, real-time measured information about a gap distance between the poles and the counter surface and/or a magnetic flux at the poles is measured to adjust the current to a level that ensures the required force. However, even if the gap distance is measured, it is not used to select the force set point, but only to adjust the current that is needed to realize the force set point.

In an embodiment of the apparatus the soft magnetic element and magnetizable core are provided in a slot, which has sidewalls that extend parallel to the path of movement of table. The sidewalls have a high magnetic permeability to shield magnetic fields from the core and the soft magnetic element. Thus, the suspension mechanism can be made more compatible with charged particle beam processing equipment. In a further embodiment a number of pairs of sidewalls may be provided alternately connected to the table and to the support structure. In another embodiment the sidewalls also shield the magnets of a linear motor that is used to drive the table along the processing path.

In another embodiment degaussing magnets are provided adjacent the poles of the magnetizable core, and arranged so that a remanent magnetization of the soft magnetic field is reduced following passage of the poles during movement along said path. Preferably, degaussing magnets are provided on either side of the poles so that they trail the poles both when the table is moved back and when it is moved forth, but, if it can be ensured that the table does not move back over significant distances when the suspension is active, degaussing magnets on a single side may suffice.

In another embodiment permanent pretensioning magnets are provided attached to the table, which act on the soft magnetic element in parallel with or through the magnetizable core. Thus, power dissipation is reduced.

Among others, it is an object of the invention to improve the usefulness of a magnetic reluctance actuator in an apparatus wherein magnetic field strengths should be kept low.

According to an aspect of the invention the active part of the reluctance actuator is provided with two arrays of magnetizable fingers that lie interdigitated extending in a face of the active part that faces the passive surface. Each array of fingers has its own magnetizable base, to which only the fingers of the array are connected and the bases are coupled to each other via a magnetizable return path in which a magnetic field can be generated with an electric coil. In this way a magnetic field with many poles can be generated within a small space. When such a field is moved along the passive surface it leaves less remanent magnetization than an E or U shaped core. Also the field remote from the active part drops off more sharply. Preferably, the fingers extend from the bases in mutually opposite direction. This minimizes the required space.

In an embodiment the set of fingers, bases and return path of the active part are formed from a sheet of magnetizable material, from which the fingers form crenellated edges on opposite ends of the sheet, which sheet has been folded so that the fingers on the opposite ends lie interdigitated in the face of the active part. Thus, the active part can be realized in a simple way.

These and other objects and advantageous aspects of the invention will be described in more detail using the following figures.

FIG. 1 shows a charged particle beam processing apparatus with positioning equipment. The apparatus contains a support structure 10, a substrate table 12, a magnetic reluctance actuator with an active part 14 (support structure providing a passive part, not shown), a reference structure 16, a sensor 17, a charge particle source 18 and a substrate 19. For reference an x, y and z direction are indicated (the latter perpendicular to the plane of the drawing. Table 12 is movable over a range of positions (indicated by arrows) in the x-direction over support structure 10. Although movability along a path in a single (x-) direction is shown, it will be understood that movability of table 12 along paths in more than one direction (also in the z-direction) may be provided for. Sensor 17 is arranged to measure a distance between table 12 and reference structure 16. Reference structure 16 is mechanically isolated from support structure 10, in the sense that it is distinct from the part of support structure that faces active part 14 and, if coupled at all, preferably coupled via vibration damping connections, as is known per se for example for metrology frames in photolithographic equipment. Thus, vibrations and deformations of the counter surface are substantially not communicated to the reference structure 16 (e.g. less than 20% and more preferably less than 1%). Charged particle source 18 is arranged to produce a beam 18a of charged particles aimed at substrate 19 on substrate table 12.

Figure 1:
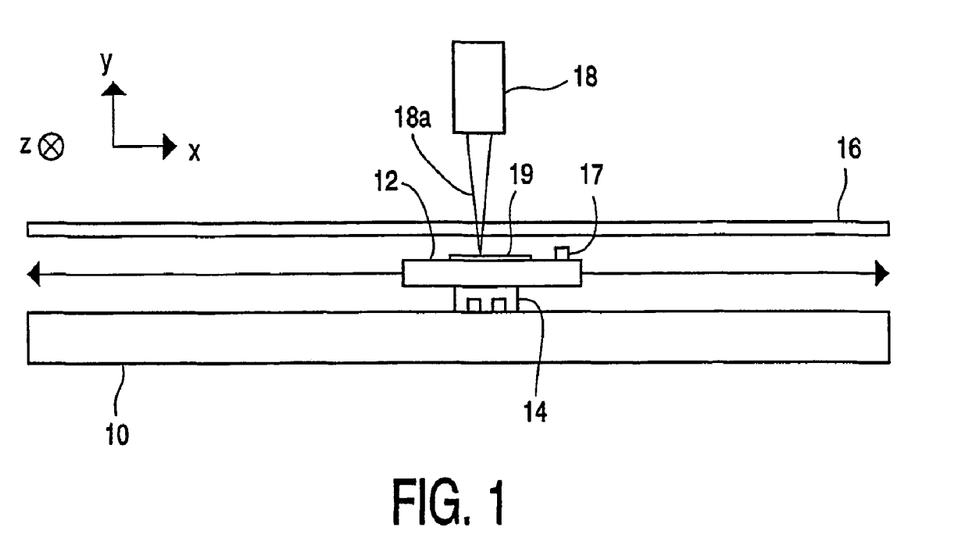
FIG. 1 shows a charged particle beam processing apparatus
Figure 2:
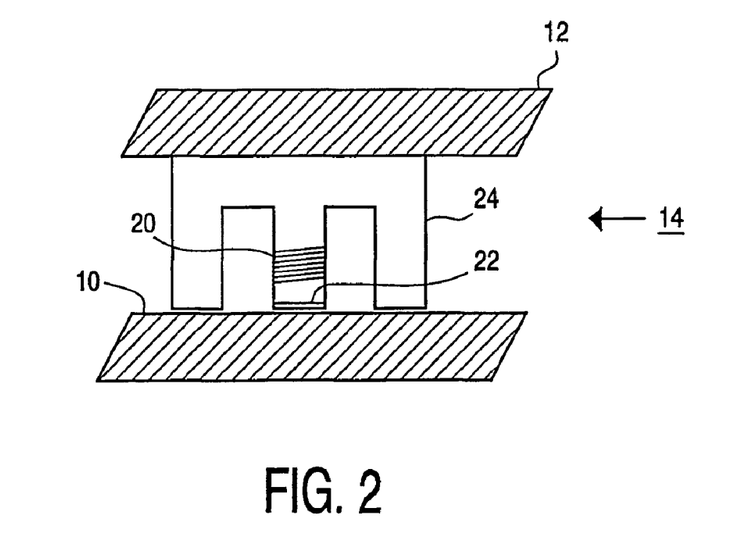
FIG. 2 shows parts of a magnetic reluctance actuator

FIG. 2 shows active part 14 in more detail. Active part 14 contains an E shaped soft magnetic core 24, with three legs directed towards a surface of support structure 10, an electric current winding 20 around a central leg of core 24 and a gap distance sensor 22 in a gap between the central leg and the surface of support structure 10. (As used herein, "soft-magnetic" material is a material that develops a high magnetization under influence of a magnetic field, the magnetization substantially disappearing when the field is removed). It will be understood that for certain types of sensors it is not necessary to place sensor 22 in the gap between the central leg and support structure: instead sensor 22 may be located adjacent a leg, so that the gap size need not be increased for the sensor, or in the gap formed by another leg.

In operation a beam 18a of charged particles is projected onto substrate 19, e.g. for adding or removing material from substrate 19, or for measuring properties of substrate 19, or changing the material properties of substrate 19 at or near its surface. Table 12 is moved to different positions relative to beam 18a. Active part 14 is used as a suspension to keep table 12 at a controlled position in the y-direction perpendicular to support structure 10. A magnetic force is exerted between active part 14 and a magnetizable part of support structure 10. Table 12 is subjected (by some means not shown) to a pretension force that acts along this y-direction, which is compensated by this magnetic force, so that table 12 remains at a required position in the y-direction.

Although for the sake of simplicity an implementation of active part 14 is shown that acts to exert a downward force on table 12, it will be understood that by means of different arrangements an upward force may be realized. In the case of a downward force by active part 14 the pretension force is of course in the upward direction, whereas in the case of a downward force by active part 14 the pretension force is in the downward direction etc. Also for the sake of simplicity only one actuator is shown, it will be understood that other actuators may be present, e.g. for exerting other forces in the y-direction to keep table 12 at a required orientation and/or one or more actuators that act sideways, in the z direction for example, to control position and/or orientation.

Figure 3:
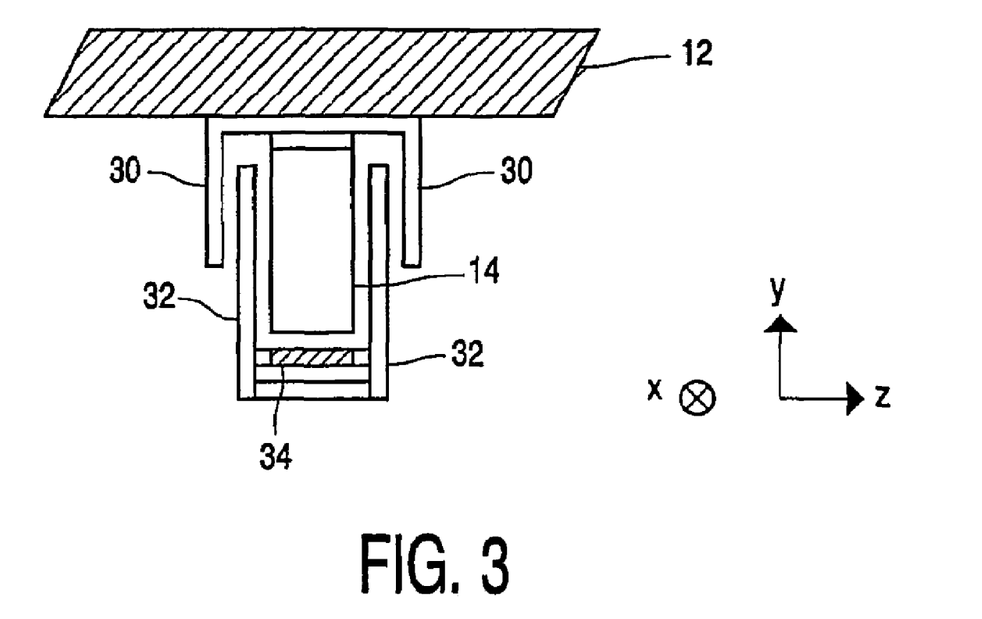
FIG. 3 shows a shielding structure

FIG. 3 shows an yz cross-section of active part 14 facing a magnetizable strip 34 that forms the relevant surface of the support structure for the purpose of exerting a force. Strip 34 extends along the x direction, substantially over the entire range of possible x-movement of table 12. Strip 34 is mounted in a shielding structure with sidewalls 32 of magnetically highly permeable material and a bottom of magnetically highly permeable material connecting the sidewalls 32. Sidewalls and bottom extend as far as strip 34, or further in the x-direction. When table 12 moves in the x-direction active part 14 moves between sidewalls 32. Preferably, strip 34 is attached to sidewalls 32 via a substantially non-magnetizable connection.

Enclosing sidewalls 30 are provided, which are mutually connected by a bottom and are attached to table 12, so that a top part of sidewalls 32 is contained between enclosing sidewalls 30 and the magnetizable part of the active part 14 is enclosed at the top by the enclosing sidewalls 32 and their connection bottom. Enclosing sidewalls 32 and their connecting bottom are of highly magnetizable material; preferably the magnetizable part of active part 14 is separated from enclosing sidewalls 32 and their connection bottom by material that is substantially non-magnetizable. Enclosing sidewalls 32 extend beyond the side legs of core 24 in the x-direction.

Enclosing sidewalls 30 and sidewalls 32 serve to shield magnetic stray fields from active part 14 and strip 34. When table 12 moves up and down relative to the support structure or in the x-direction along the support structure, the top extremities of sidewalls 32 remain contained between enclosing sidewalls 30. As a result magnetic stray fields are substantially suppressed. In an embodiment a plurality of interdigitated alternations of sidewalls attached to the support structure and sidewalls attached to table 12 may be used to realize further improved shielding. In another embodinent only sidewalls 32 attached to support structure 10 are present and no enclosing sidewalls. In another embodiment only enclosing sidewalls 30 attached to table 12 are present and no sidewalls attached to the support structure. Similarly, in an embodiment the sidewalls attached to table 12 may be located between the sidewalls attached to support structure. The number of sidewalls depends on the required amount of shielding.

In another embodiment the connection between table 12 and core 24 has a substantially non-magnetizable neck portion that is narrower than core 24 and enclosing sidewalls 32 have a top part or top parts that project inward from the enclosing sidewalls, so that core 24 is partly enveloped from above, except for a slot for passing the neck. Furthermore, it will be realized that strip 34 and core 24 need not be located so that the magnetic field between strip 34 and core 24 runs parallel to the sidewalls. For example, strip 34 and core 24 may be provided rotated over ninety degrees, so that the magnetic field runs perpendicular to the sidewalls. In this way positioning in selectable directions may be realized.

Figure 3A:
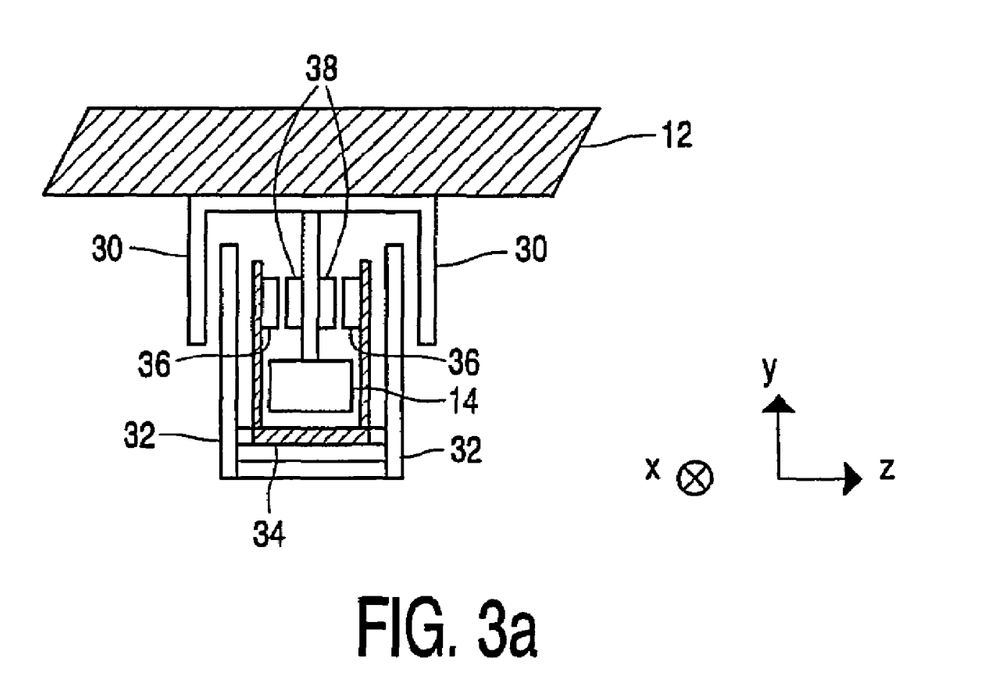
FIG. 3a shows a further shielding structure

FIG. 3a shows a further embodiment in which a linear motor is used to move table 12 along its main stroke direction (the x-direction). This linear motor, which is known per se, will be briefly described. The linear motor comprises a pair of parallel walls attached to the support structure 10. On the walls rows of alternatingly poled magnets 36 are provided, in order to generate magnetic fields of spatially alternating directions in the space between the sidewalls. A motor winding 38 connected to table 12 is located in the space between the walls and current is driven through the motor winding to move the table in the direction of alternation of the field direction. In addition shielding sidewalls 32 of highly magnetizable material may be provided at a location so that the magnets and their support structure are contained between the shielding sidewalls.

According to one aspect of the invention, the sidewalls of the linear motor are used as sidewalls 32 for shielding the field from the magnetic reluctance actuator as well. Preferably a motor winding 38 is attached to a connection between core 24 and table 12. In this way the shielding sidewalls 32 are used to shield both the fields from the linear motor and the fields from the reluctance actuator (it will be understood that the field from other types of actuators, e.g. Lorentz actuators, may be shielded in the same way). Preferably, the magnets of the linear motor are mechanically connected to the shielding sidewalls via substantially non-magnetizable connections. Typically strip 34 is attached in parallel to a wall that connects the sidewalls, or it is part of a magnetizable support structure for magnets 36 connecting the opposing support walls, or attached to it. But strip 34 may also be attached to the sidewalls or the connecting wall, when the ends of the legs of core 24 face toward a sidewall.

In operation, to exert a force between table 12 and support structure 10, a current is supplied through windings 20, which generates a magnetic flux that runs though the central leg of core 24 through a gap to strip 34 and from strip 34 through gaps to the side legs of core 24 and from there back to the central leg. The magnetic flux induces magnetization in both core 24 and strip 34 and as a result a force is exerted between strip 34 and core 24 (and thereby between support structure 10 and table 12. This force is proportional to the flux times the induced magnetization. The flux is approximately proportional to the current "I" supplied to windings 20, divided by the sum "d" of the distances between the legs of core 24 and strip 34 in the gaps. The magnetization is proportional to the flux. As a result the force between core 24 and strip 34 is approximately proportional to $$(I/d)^2$$

Figure 4:
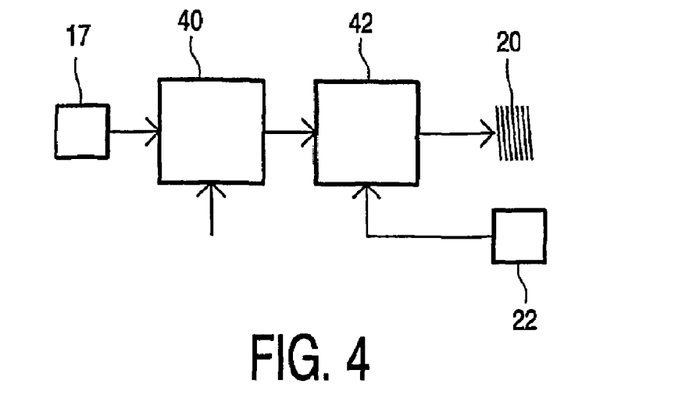
FIG. 4 shows a control circuit

FIG. 4 shows a circuit for regulating the force. This circuit contains sensor 17, an outer control circuit 40, an inner control circuit 42, windings 20 and gap distance sensor 22. Sensor 17 senses the distance between reference structure 16 and table 12 (not shown) and has a sensing signal output coupled to outer control circuit 40. Outer control circuit 40 has a force set point output coupled to a first input of inner control circuit 42, which has a second input coupled to an output of gap distance sensor 22. Inner control circuit 42 has an output coupled to windings 20.

In operation sensor 17 senses the distance between reference structure 16 and table 12, using interferometric techniques for example, or any other precision measurement technique. Outer control circuit 40 compares the measured position with a required position, which is typically selected by a control computer (not shown), but may also be a predetermined value set locally in outer control circuit 40. Outer control circuit 40 selects a force set point value Fs dependent on the sign and size of the difference between the measured distance ym and the required distance yr. By way of example, outer control circuit 40 may select the force set point value Fp proportional to the difference ym-yr, or a low pass frequency filtered version of this difference.

Inner control circuit 42 sets the current through windings 20 so that the required force is realized. This may be done using a feed forward circuit that generates a current I $$I = Cd \sqrt{(Fp)}$$

with a size proportional to the measured gap distance d determined by gap distance sensor 22 and the square root of the force set point value (of course outer control circuit 42 may supply the set point in the form of a signal proportional to this square root). The constant of proportionality C depends on the material properties of core 24 and strip 34 etc. A feed forward circuit may be used. Alternatively, inner control circuit 42 may contain a feedback loop that regulates the current I to a selected size.

A flux sensor may be used as an alternative to (or in addition to) gap distance sensor 22. The flux sensor may be a Hall effect sensor located in a gap between a leg of core 24 and strip 34 or, in case of AC currents or a saturating core, one or more pick-up windings around a leg or the backbone of core 24. The force exerted between core 24 and strip 34 is proportional to the square of the measured flux B, but not further dependent of the gap size "d" (the gap size affects the force through the flux only).

Figure 5:
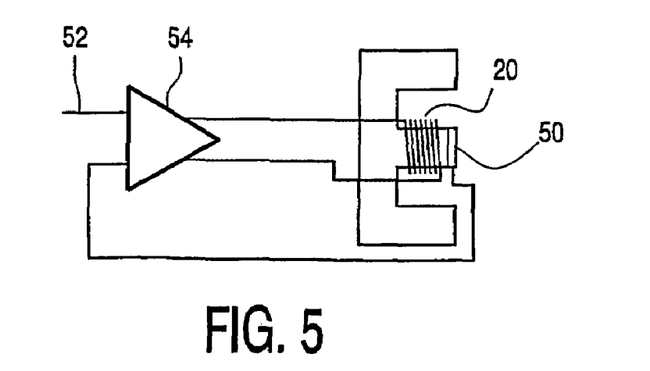
FIG. 5 shows another control circuit

FIG. 5 shows an embodiment of inner control circuit 42 with a sensor 50 and a local feedback amplifier 54 to regulate the current I through winding 20 so that the measured flux value B corresponds to the value required for the force set point. Preferably, in this case outer control circuit 40 computes the square root of the required force and supplies a signal proportional to this root as set point value at an input 52 of inner control circuit 42. Together outer control circuit 40 and inner control circuit 42 are part of a feedback loop that regulates the measured distance ym to a set value. The speed of this feedback loop is much slower than the response speed of inner control circuit 42 (which, if it contains a feedback loop, forms a loop nested in the position feedback loop). The response speed of inner control circuit 42 is set so that variations of the gap distance d due to vibrations of strip 34, and/or height variations of strip 34 when table 12 moves active part 14 along support structure 10, do not affect the exerted force on a time scale of the speed of the feedback loop for the measured distance. Effectively, the speed of adjustment of the current is faster than any significant changes in the gap size. Typically, inner control circuit 42 may be implemented as a high speed analogue circuit or feedback circuit, whereas outer control circuit 42 may be implemented with a suitably programmed computer or signal processor, which also performs other functions. However, it should be appreciated that even with a flux sensor a flux feedback loop is not strictly necessary. The flux sensor can be used as a gap distance sensor, by dividing the current through winding 20 by the flux. The result is proportional to the gap distance and can be used in a feed forward loop to control the current.

In its simplest form, the control circuit uses measurements of the position of table 12 relative to reference structure 16 to select forces that regulate that position to a set value. However, more complicated control schemes may be used. For example, the forces may be adapted to predicted forces during movement.

Figure 4A:
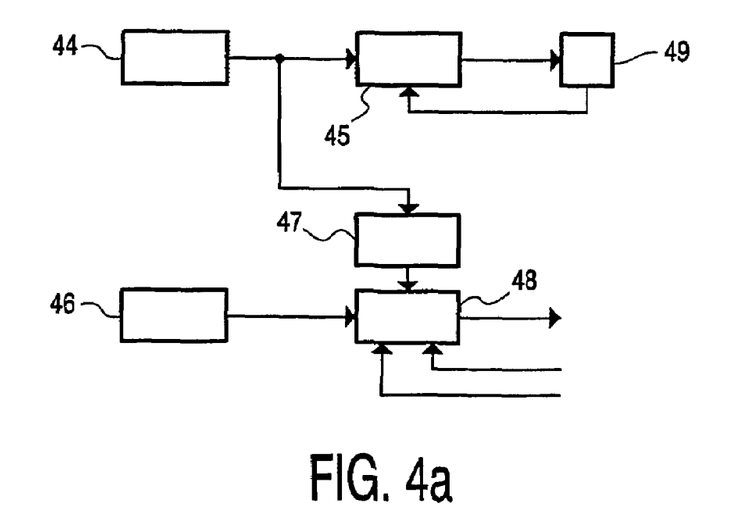
FIG. 4a shows a further control circuit

FIG. 4a shows a more advanced control system, containing a position setpoint generator 44, a position control loop 45, a bearing setpoint generator 46, a feedforward force generator 47 and a bearing control loop 48. Position control loop 45 drives a motor 49 that moves the table along the x direction and receives back position information from the motor, or from a sensor that measures the position of the table. Position control loop 45 receives set point values from setpoint generator 44. Position control loop 45 regulates the position of the table to x-position set point values from setpoint generator 44.

Bearing control loop 48 contains the circuit described with respect to FIG. 4 and/or 5. Bearing control loop 48 receives set points from bearing setpoint generator 46, gap size measurements and/or flux measurements and measurements of position relative to reference structure 16. Bearing control loop 48 computes force values for regulating the measured position relative to reference structure 16 to a set point value, for example by setting the force linearly proportional to deviation from the set point value, or according to any other function, such as a function that saturates to a predetermined force when the deviation is above a maximum value for example.

Bearing set point generator 46 selects set points corresponding to a fixed distance to reference structure 16 for example, or dependent on a feedback loop to regulate the position dependent on focussing information. In a further embodiment bearing set point generator may generate the bearing setpoints dependent on the x-position set-points, to account for known height variations on substrate 19, for example.

Feedforward force generator 47 computes forces due to inertia experienced by the table during movement driven by motor 49 and supplies information about computed force values to bearing control loop 48. Bearing control loop 48 subtracts these forces from the forces selected to regulate the position of the table and controls the exerted force according to the computed difference. Thus, forces generated by movement do not affect bearing position control.

It will be appreciated that the apparatus has been described by way of example only, and that many variations are possible. For example, in addition to the x movement mechanism a z movement mechanism may be provided for moving the table in the z-direction. The resulting forces may be compensated as well. Furthermore it may not be necessary to compensate the entire force, or the compensation may depend on the circumstances.

Although separate units are shown in FIG. 4a, it will be appreciated that in fact all or part of the units may be implemented as computer programs running on one or a plurality of computers.

Furthermore, although a single actuator was shown, it will be appreciated that in fact more similar or other actuators may be present, e.g. to control position and rotation in a number of degrees of freedom. Also, although the E-shaped core was shown extending along the direction of movement, it will be appreciated that other orientations are possible.

Figure 6:
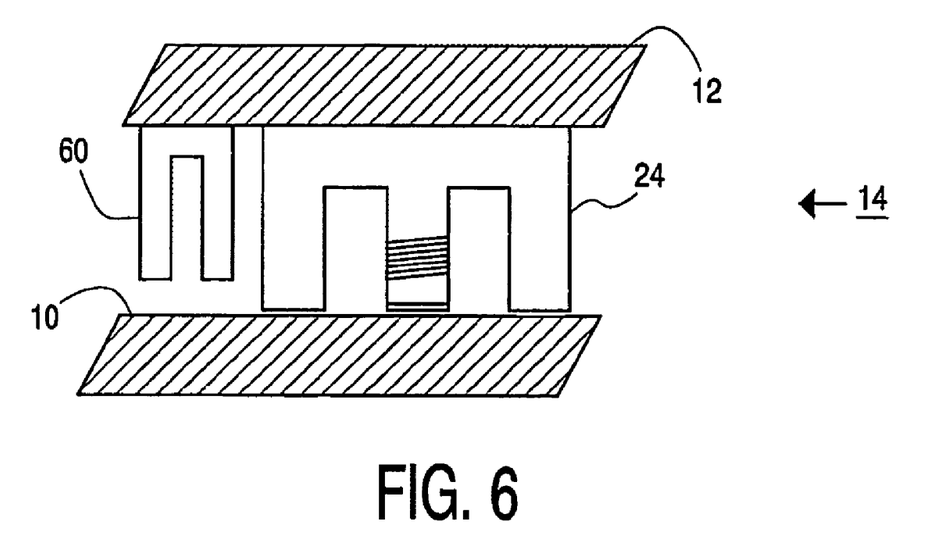
FIG. 6 shows a reluctance actuator with an additional magnet

FIG. 6 shows a further embodiment of the active part 14. In this embodiment a permanent magnet 60 has been on mounted table 12 next to core 24, with a larger gap distance to support structure 10 than core 24. In operation a magnetic force Fp is exerted between permanent magnet 60 and support structure 10. As a result, only part of the total force Ft that has to be exerted between table 12 and support structure 10 has to be provided by the force Fe exerted by core 24. This reduces power consumption. It will be understood that instead of a using separate permanent magnet 60, this permanent magnet may also be attached to core 24, so that flux from the permanent magnet that reaches strip 34 runs mainly through core 24, or separate parts of core 24 may be connected via the permanent magnet.

In addition, when a separate magnet is used the gap distance of permanent magnet 60 is preferably selected so large that in proportion to the total force the force Fp exerted by permanent magnet 60 has a smaller negative stiffness (derivative dFp/dy with respect to the distance between table 12 and support structure 10) than the force Fe exerted by core 24 ((d(Fp+Fe)/dy)/(Fp+Fe)<(dFe/dy)/Fe)).

Figure 7:
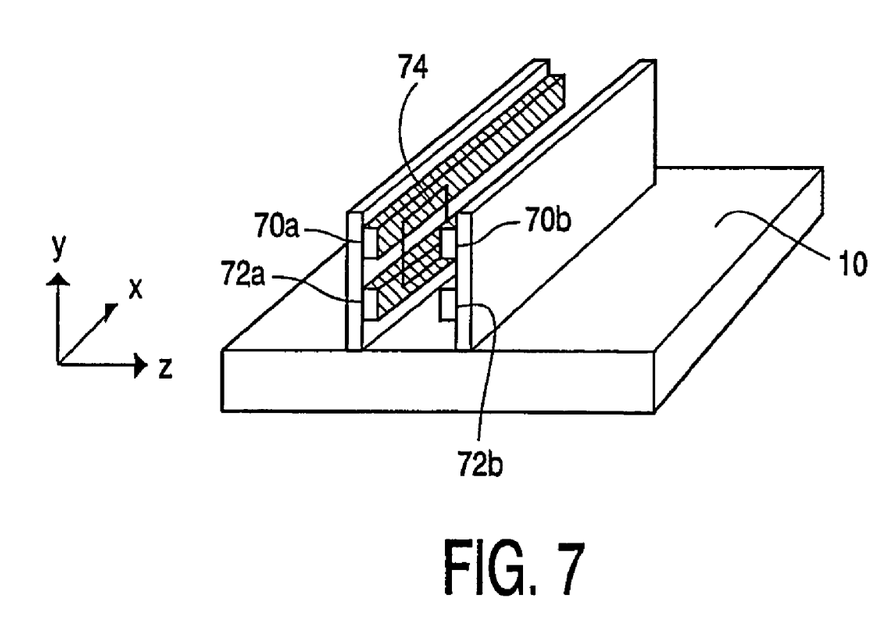
FIG. 7 shows a bearing with a long stroke Lorenz actuator

FIG. 7 shows an alternative to a suspension with a reluctance actuator. In this alternative permanent magnets 70*a,b*, 72*a,b* are provided on support structure 10, the poles of the permanent magnets 70*a,b*, 72*a,b* extending substantially along the entire length of the path along which the table (not shown) is moved (along the x-direction). A winding 74 attached to the table (not shown) is provided in a slot between opposite pairs of permanent magnets 70*a,b*, 72*a,b*. Winding 74 extends over less than the extent of table 12, or at least not substantially beyond the extent of table 12 and therefore extends only over a small fraction of the extent of permanent magnets 70*a,b*, 72*a,b*. Permanent magnets 70*a,b*, 72*a,b* are arranged in pairs on either side of a slot and generate magnetic flux running in a z-direction from one side of the slot to the other transverse to the direction of movement of the table. Flux of mutually opposite polarity is provided by a higher pair of magnets 70*a,b* and a lower pair of magnets 72*a,b* respectively. Thus, a Lorentz actuator is formed, which acts to exert a force in the y-direction when current is supplied through winding 74.

This structure can be used as an alternative to the reluctance actuator. The advantage of using a Lorentz actuator is that its response is highly linear, which simplifies the design of the control system, the force that it exerts is insensitive to vibrations. However, when magnetic stray fields are a problem, as in the case of equipment that uses a beam of charged particles, shielding is needed to prevent disturbances from stray fields.

Magnetic bearings have many advantages: no moving mechanical contacts are needed, with the result that little or no wear or vibrations occur, bearing forces can be controlled very accurately, the operation is compatible with high vacuum etc. In view of these advantages it would be desirable to use magnetic bearings also in imaging apparatuses that use charged particles. However, in this case a problem arises, in that magnetic fields generated by a magnetic bearing can affect the targeting of the charged particles. Lorentz actuators in particular have this effect, because they include permanent magnets that generate magnetic fields and a space through which a winding moves. In practice the magnetic field problem has been solved mainly by spatially separating the magnetic bearings from the regions of the apparatus that are sensitive to magnetic fields. The further the separation, however, the more awkward the construction of an apparatus.

Magnetic reluctance bearings could be used to realize a simple and low power magnetic bearing that relieves this problem. In a magnetic reluctance actuator wherein an active part has to move along a surface, suspended at a distance from a surface, the surface may be a passive, soft magnetizable, but generally unmagnetized surface. Magnetization is induced in the surface locally by the active part. Typically, the active part is an E or U shaped magnet, with north and south poles that face the passive surface and an electric coil around one of the legs. No fields need to be generated outside the active part and the part of the surface that faces the active part. As a result, when a passive, normally unmagnetized surface is used, the surface may be located quite close to the field sensitive regions of the apparatus.

In practice, however, the soft magnetizable surface inevitably exhibits a small remanent magnetic field. This imposes a limit on the usefulness of this type of bearing. Moreover, the active part, even when it is located at a distance, may generate overly strong fields.

Among others, it is an object of the invention to improve the usefulness of a magnetic reluctance actuator in an apparatus wherein magnetic field strengths should be kept low.

Figure 8:
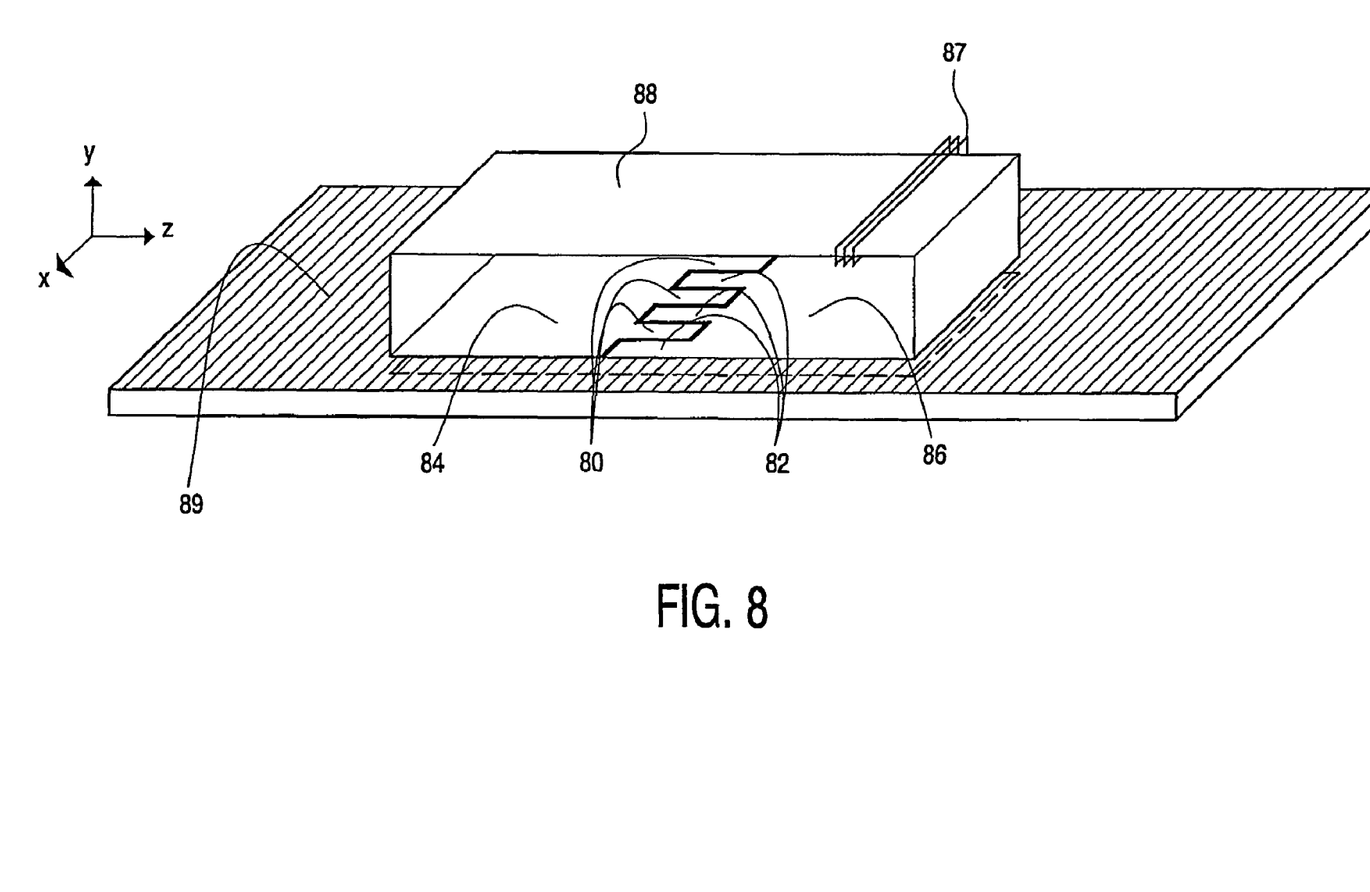
FIG. 8 shows an embodiment of a reluctance actuator

FIG. 8 shows a part of another embodiment of a magnetic reluctance actuator, with a magnetizable surface 89 and an active part 80, 82, 84, 86, 87, 88. Generally, the actuator replaces E shaped core 24 and surface 89 is part of strip 34 or support structure 10. The actuator functions for example as part of a magnetic bearing, which keeps the active part and surface 89 at a predetermined distance from one another in the direction perpendicular to surface 89 (the y-direction), while permitting freedom of movement in one or more direction (the x or z direction) along surface 89.

The active part contains two arrays of fingers 80, 82, bases 84, 86 and a return path 88. Windings 87 have been wound around return path 88. The fingers 80, 82 of both arrays lie in a face of the active part that faces surface 89. The fingers 80 of the first array alternate with the fingers of the second array. The fingers 80 of the first array extend from first base 84 which is connected to second base 86 via return path 88. The fingers 82 of the second array extend from second base 86.

Typically, the active part may be constructed starting from a sheet of soft magnetic metal, forming crenellations on mutually opposite extreme parts of the sheet, and folding the sheet back on itself, so that the crenellations interdigitate. In operation, the actuator is used to generate forces in a direction (the y-direction) perpendicular to surface 89. Typically, a pretension force is realized that acts to force the active part away from surface 89 (e.g. by means of gravity, if the active part is below surface 89). Current is applied though windings 87 to generate a magnetic field that runs through trough bases 84, 86, return path 88, fingers 80,82 and the space between the fingers 80 of the first array and the fingers 82 of the second array. Part of the field between the arrays of fingers 80, 82 reaches surface 89, in which the field induces magnetization, with the effect that an attractive force is generated between the active part and surface 89. Typically, the electric current through windings 87 is regulated so that the attractive force compensates other forces that would cause the active part to move away from surface 89.

Figure 9:
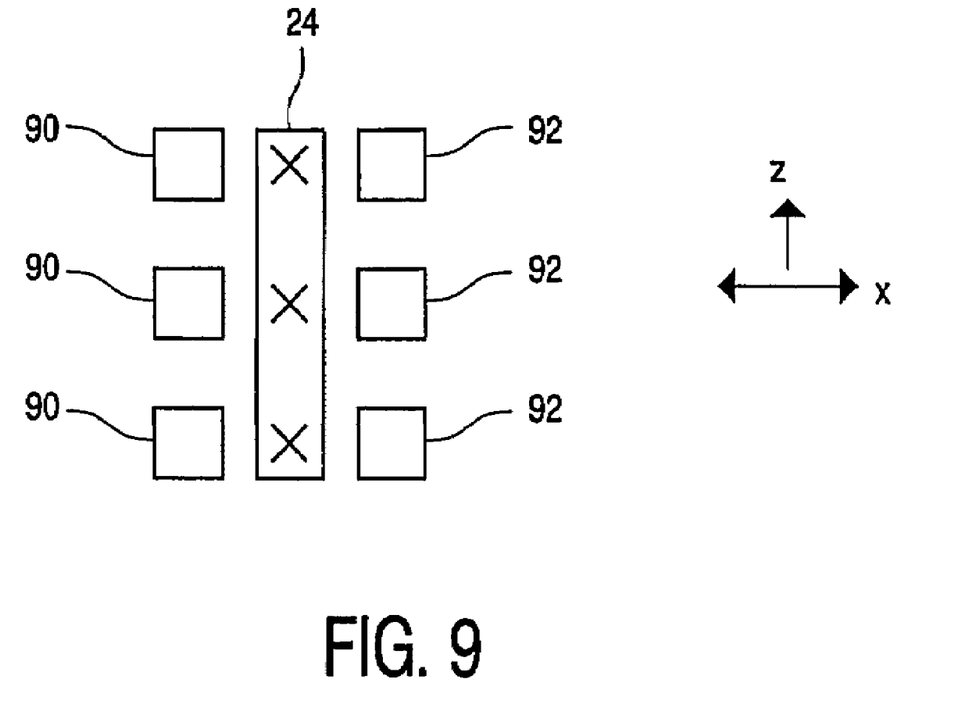
FIG. 9 shows an actuator with degaussing magnets

The advantage of this structure is that stray fields are reduced. It will be understood that this applies in the case of movement both along the direction of the row of fingers since only a narrow strip of surface 89 will exhibit remanent magnetization, but also in the case of movement perpendicular to the row, since the field from each finger will be quite small. It will be understood that this type of active part, too, may be accompanied by a permanent magnet for providing pretension FIG. 9 schematically shows an embodiment in which degaussing magnets 90, 92 have been added to the E shaped core 24 in order to reduce the remanent magnetization in the counter surface (strip 34 or surface 89) once the core has moved on. Degaussing techniques are know per se and involve for example inducing magnetic fields near the counter surface with polarity at locations on the counter surface opposite to the polarity of the fields applied by the cores, but with smaller strength so that a substantially zero net remanent magnetization results in the counter surface. In the figure the line along which the poles (marked by x) of core 24 lie is perpendicular to the direction of movement of the table (the x-direction). First degaussing magnets 90 are each placed next to a respective pole along the direction of movement on one side of core 24. Second degaussing magnets 90 are each placed next to a respective pole along the direction of movement on the other side of core 24. However, if it can be ensured that the table 12 moves over significant distance along the x-direction in one direction only during processing when the suspension is active degaussing magnets on a single side may suffice It will be appreciated that such degaussing magnets may also be used for the crenellated core of FIG. 8. In this case the magnets may be placed on either side next to the end of the row of fingers.

The invention claimed is:

1. A precision processing apparatus for processing an object (19) at accurately controlled positions, the apparatus comprising
   a working platform (12) for supporting the object (19) to be processed;
   a support structure (10) for providing support to the working platform (12), the working platform (12) being movable relative to the support structure (10) along a path, the support structure (10) containing a soft magnetic element (34) with a surface that extends in parallel with said path;
   an suspension actuator part (14) attached to the working platform (12), the suspension actuator part (14) comprising a soft magnetic core (24) with poles facing the surface of the soft magnetic element (34) and a winding (20) for application of a current to generate a magnetic field that runs through the core (24) via the poles and returns via the soft magnetic element (34);
   a position reference element (16), mechanically decoupled from the soft magnetic element (34);
   a sensor (17) for producing a sensing result indicative of a measured position of the suspension actuator part (14) relative to the position reference element (16);
   a control circuit comprising an outer control circuit (40) and an inner control circuit (42), the outer control circuit (40) receiving said sensing result and determining force set point information to regulate the measured position of the actuator part (14) to a required value, the inner control circuit (42) receiving the force set point information and controlling the current to realize a force between the actuator part (14) and the support structure (10) according to the force set point information.

2. A precision processing apparatus according to claim 1, wherein the suspension actuator part (12) comprises a flux sensor and/or gap size sensor (22) coupled to the inner control circuit (42), the inner control circuit (42) adapting the current dependent on a sensed flux or gap size to realize the force according to the force set point information.

3. A precision processing apparatus according to claim 1, comprising a magnetic field shielding wall (30, 32) on either side of a slot wherein the soft magnetic element and the poles of the soft magnetic core are provided.

4. A precision processing apparatus according to claim 3, comprising a first and second pair of magnetic field shielding walls (30, 32) on either side of the slot, the walls (32) of the first pair being attached to the support structure (10) and extending parallel to said path along substantially the entire length of the path on either side of the slot, the walls (30) of the second pair being attached to the platform (12) and extending parallel to part of said path on either side of the slot.

5. A precision processing apparatus according to claim 3, comprising a linear motor for driving the platform (12) to move along said path, the linear motor comprising a motor winding (38) attached to the platform (12) and rows of alternatingly poled magnets (36) attached to the support structure (10) and located between the magnetic field shielding walls (32), the motor winding (38) being provided between said rows of magnets (36), on a connection between the platform (12) and the soft magnetic core (24).

6. A precision processing apparatus according to claim 1, comprising degaussing magnets (90) located adjacent said core (24) on at least one side trailing the core (24) along the direction of movement, arranged to reduce a remanent magnetization left by the magnetic field from said core (24) in the soft magnetic element (34).

7. A precision processing apparatus according to claim 1, comprising at least one pretensioning permanent magnet (60) attached to the platform to act on the soft magnetic element (34) in parallel with the core (24) or through the core (24).

8. A precision processing apparatus according to claim 1, wherein the suspension actuator part (14) comprises a first and second array of magnetizable fingers (80, 82), a first and second magnetizable common base (84, 86) on which all fingers (80, 82) of the first and second array are mounted respectively, and a magnetizable return path (88) coupling the first and second base (84, 86), the fingers (80, 82) of both the first and second array lying in a face of the core arrangement that faces a counter surface (89) of the soft magnetic element, the fingers (80) of the first array lying extending interdigitated with the fingers (82) of the second array in said face; the winding (87) being arranged around the return path (88).

9. A precision processing apparatus according to claim 8, wherein the fingers (80, 82) of the first and second array extend from the first and second base (84, 86) in mutually opposite directions.

10. A precision processing apparatus according to claim 8, wherein the fingers (80, 82) of both the first and second array, the first and second base (84, 86) and the return path (88) are integral parts of a sheet of magnetizable material, the fingers (80, 82) of the first and second array forming crenellations extending from mutually opposite extreme parts of the sheet respectively, the sheet having been folded so that the extreme parts lie in said face, the crenellations of the opposite edges lying interdigitated in said face.

11. A precision processing apparatus according to claim 1, wherein the outer control circuit (40) has an input for receiving information that is indicative of a movement related force experienced by the platform (12) due to movement along said path, the outer control circuit (40) compensating the force set point for the movement related force.

12. A precision processing apparatus according to claim 1, comprising a particle beam source (18) for generating a beam (18*a*) of electrically charged particles directed at the object (19) on said platform (12).

13. A charged particle processing apparatus for processing an object (19) with a beam (18*a*) of charged particles, the apparatus comprising
   a working platform (12) for supporting the object (19) to be processed;
   a support structure (10) for providing support to the working platform (12), the working platform (12) being movable relative to the support structure (10) along a path, the support structure (10) containing a soft magnetic element (34) with a surface that extends in parallel with said path;
   a suspension actuator part (14) attached to the working platform, the suspension actuator part comprising a soft magnetic core (24) with poles facing the surface of the soft magnetic element (34) and a winding (20) for application of a current to generate a magnetic field that runs through the core (24) via the poles and returns via the soft magnetic element (34);

a magnetic field shielding wall (30, 32) on either side of a slot wherein the soft magnetic element (34) and the poles of the soft magnetic core (24) are provided.

14. A charged particle processing apparatus according to claim 13, comprising a first and second pair of magnetic field shielding walls (30, 32) on either side of the slot, the walls (32) of the first pair being attached to the support structure and extending parallel to said path along substantially the entire length of the path on either side of the slot, the walls (30) of the second pair being attached to the platform and extending parallel to part of said path on either side of the slot.

15. A precision processing apparatus according to claim 13, comprising a linear motor for driving the platform (12) to move along said path, the linear motor comprising a motor winding (38) attached to the platform and rows of alternatingly poled magnets (36) attached to the support structure (10) and located between the magnetic field shielding walls (30, 32), the motor winding (38) being provided between said rows of magnets (36), on a connection between the platform (12) and the soft magnetic core (24).

16. An apparatus with a reluctance actuator that comprises a counter surface (89) of magnetizable material;

an active part mounted moveable relative to the counter surface (89), the active part comprising a first and second array of magnetizable fingers (80, 82), a first and second magnetizable common base (84, 86) on which all fingers (80, 82) of the first and second array are mounted respectively, and a magnetizable return path (88) coupling a first and second base (84,86), the fingers (80, 82) of both the first and second array lying in a face of the core arrangement that faces the counter surface (89), the fingers (80) of the first array lying extending interdigitated with the fingers (82) of the second array in said face;

an electric coil (87) with at least one winding arranged to induce a magnetic field along the return path (88).

17. An apparatus according to claim 16, wherein the fingers (80, 82) of the first and second array extend from the first and second base (84, 86) in mutually opposite directions.

18. An apparatus according to claim 16, wherein the fingers (80, 82) of both the first and second array, the first and second base (84, 86) and the return path (88) are integral parts of a sheet of magnetizable material, the fingers (80, 82) of the first and second array forming creneuations extending from mutually opposite extreme parts of the sheet respectively, the sheet having been folded so that the extreme parts lie in said face, the crenellations of the opposite edges lying interdigitated in said face.

19. An apparatus according to claim 17, comprising degaussing magnets (90) located adjacent said core on at least one side trailing the core along a direction of movement along the counter surface (89), to reduce a remanent magnetization left by the magnetic field from said fingers (80, 82) in the counter surface after movement of the active part.

20. An apparatus according to claim 17, comprising at least one pretensioning magnet (60) coupled to the active part to act on the counter surface (89) in parallel with magnetic fields from the teeth or through the teeth.

21. An apparatus according to claim 17, comprising a beam space and a particle source (18) for generating a beam (18*a*) of electrically charged particles in said beam space, the counter surface (89) being located adjoining the beam space.

* * * * *